(12) United States Patent
Cho et al.

(10) Patent No.: US 8,198,722 B2
(45) Date of Patent: Jun. 12, 2012

(54) SEMICONDUCTOR PACKAGE

(75) Inventors: Youngsang Cho, Yongin-si (KR);
Donghan Kim, Osan-si (KR); Daewoo Son, Cheonan-si (KR); Kyoungsei Choi, Yongin-si (KR); Yechung Chung, Hwaseong-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 232 days.

(21) Appl. No.: 12/580,306

(22) Filed: Oct. 16, 2009

(65) Prior Publication Data

US 2010/0102432 A1   Apr. 29, 2010

(30) Foreign Application Priority Data

Oct. 23, 2008  (KR) .................. 10-2008-0104112

(51) Int. Cl.
*H01L 23/48* (2006.01)
*H01L 23/52* (2006.01)

(52) U.S. Cl. ........ 257/690; 257/691; 257/692; 257/693; 257/E23.011; 257/E23.02

(58) Field of Classification Search .................. 257/690, 257/691, 692, 693, E23.011, E23.02
See application file for complete search history.

(56) References Cited

U.S. PATENT DOCUMENTS

| | | | | |
|---|---|---|---|---|
| 5,644,247 A * | 7/1997 | Hyun et al. | ............... | 324/750.05 |
| 6,498,396 B1 * | 12/2002 | Arimoto | ........................ | 257/737 |
| 6,600,335 B2 * | 7/2003 | Tay et al. | .................. | 324/750.05 |
| 6,642,627 B2 * | 11/2003 | Song et al. | ..................... | 257/786 |
| 6,656,766 B2 * | 12/2003 | Noshita | .......................... | 438/106 |
| 6,870,252 B2 * | 3/2005 | Novak et al. | ................... | 257/691 |
| 6,900,074 B2 * | 5/2005 | Miyamoto et al. | ............ | 438/108 |
| 6,950,369 B2 * | 9/2005 | Kunikiyo et al. | ........ | 365/230.07 |
| 7,138,722 B2 * | 11/2006 | Miyamoto et al. | ............ | 257/777 |
| 7,485,955 B2 * | 2/2009 | Kang et al. | ..................... | 257/701 |
| 7,901,957 B2 * | 3/2011 | Frenklakh | ........................ | 438/18 |
| 2002/0038907 A1 * | 4/2002 | Miyamoto et al. | ............ | 257/686 |
| 2002/0043986 A1 * | 4/2002 | Tay et al. | ...................... | 324/763 |
| 2002/0063264 A1 * | 5/2002 | Noshita | ........................ | 257/200 |
| 2002/0089051 A1 * | 7/2002 | Miyamoto et al. | ............ | 257/686 |
| 2002/0153602 A1 * | 10/2002 | Tay et al. | ...................... | 257/685 |
| 2003/0058205 A1 | 3/2003 | Yarita et al. | | |
| 2003/0209740 A1 * | 11/2003 | Miyamoto et al. | ............ | 257/286 |
| 2003/0209803 A1 | 11/2003 | Suzuki et al. | | |
| 2005/0035436 A1 * | 2/2005 | Novak et al. | ................... | 257/678 |
| 2005/0127531 A1 * | 6/2005 | Tay et al. | ...................... | 257/786 |
| 2006/0060639 A1 * | 3/2006 | Byrne et al. | ............... | 228/248.1 |
| 2006/0065975 A1 * | 3/2006 | Mosley et al. | ................. | 257/723 |
| 2008/0123386 A1 * | 5/2008 | Kang et al. | ...................... | 365/63 |
| 2008/0174023 A1 * | 7/2008 | Park | .............................. | 257/773 |

(Continued)

FOREIGN PATENT DOCUMENTS

JP          11-095243          4/1999

(Continued)

*Primary Examiner* — Ngan Ngo
(74) *Attorney, Agent, or Firm* — Volentine & Whitt, PLLC

(57) ABSTRACT

A semiconductor package has an interconnection substrate including a first conductive lead and a second longer conductive lead, and a semiconductor chip including a first cell region, a second cell region, a first conductive pad electrically connected to the first cell region and a second conductive pad electrically connected to the second cell region. The semiconductor chip is mounted to the interconnection substrate with the first and second conductive pads both disposed on and connected to the second conductive lead.

20 Claims, 10 Drawing Sheets

U.S. PATENT DOCUMENTS

| | | | |
|---|---|---|---|
| 2008/0217786 A1* | 9/2008 | Kasaoka et al. | 257/773 |
| 2009/0079069 A1* | 3/2009 | Jang et al. | 257/737 |
| 2009/0096075 A1* | 4/2009 | Joh | 257/686 |
| 2009/0141572 A1* | 6/2009 | Choi et al. | 365/194 |
| 2010/0052132 A1* | 3/2010 | Baek et al. | 257/686 |
| 2010/0102434 A1* | 4/2010 | Kang et al. | 257/690 |
| 2010/0127378 A1* | 5/2010 | Higuchi | 257/691 |
| 2010/0159690 A1* | 6/2010 | Kasaoka et al. | 438/612 |
| 2011/0157952 A1* | 6/2011 | Kang et al. | 365/63 |

FOREIGN PATENT DOCUMENTS

| | | |
|---|---|---|
| JP | 2003-098973 | 4/2003 |
| JP | 2003-330041 | 11/2003 |
| KR | 1020030026846 A | 4/2003 |
| KR | 1020030087973 A | 11/2003 |

* cited by examiner

SEMICONDUCTOR PACKAGE

CROSS-REFERENCE TO RELATED APPLICATIONS

This U.S. non-provisional patent application claims priority under 35 U.S.C. §119 of Korean Patent Application No. 2008-104112, filed on Oct. 23, 2008, the entire contents of which are herein incorporated by reference in their entirety.

BACKGROUND OF THE INVENTIVE CONCEPT

The present inventive concept relates to semiconductor packages. More particularly, the present inventive concept relates to semiconductor packages having a film-type of interconnection substrate, and a chip having cell regions that are to receive the same signal from an external source.

Recently, there is a demand for smaller, thinner and lighter electronic devices such as mobile phones, personal digital assistants (PDA), liquid crystal display (LCD) panels and notebook computers. Accordingly, various components of these electronic devices, for example, semiconductor devices, must be smaller and lighter and must be integrated at a higher density. Yet, such small, lightweight and highly integrated semiconductor devices must perform with a high degree of reliability.

To these ends, a semiconductor package has been developed in which a chip is mounted to a film-type of interconnection substrate having leads by which signals are transmitted to and from the chip.

SUMMARY OF THE INVENTIVE CONCEPT

An object of the present inventive concept is to provide a semiconductor package having a chip whose footprint is minimal.

Another object of the present inventive concept is to provide a semiconductor package in which the same signal can be provided to a plurality of cell regions without a voltage drop across the regions or a delay in the transmission of the signal to one of the regions.

According to one aspect of the present inventive concept, there is provided a semiconductor package in which one lead is used to deliver power and/or a signal to several different cell regions of the same chip.

The present inventive concept provides a semiconductor package including: a substrate including a base layer, first and second conductive leads extending along the base layer; and a semiconductor chip having at least a first cell region of electronic devices and a second cell region of electronic devices such that the first and second cell regions are spaced from one another, a first conductive pad electrically connected to the first cell region, and a second conductive pad electrically connected to the second cell region, wherein the semiconductor chip is mounted to the substrate with the first and second conductive pads both disposed on and connected to at least one of the first and second conductive leads, whereby the first cell region and the second cell region will both receive a signal transmitted to the second conductive lead from an outside source.

The first and second cell regions may be disposed adjacent to each other and symmetrically with respect to one another about a plane that bisects the chip in at least one of a lengthwise and a widthwise direction of the chip.

The second conductive lead may have at least a bending portion between the first conductive pad and the second conductive pad.

The first conductive pad may be disposed at one side of the semiconductor chip, and the second conductive pad may be disposed at another side of the semiconductor chip.

The semiconductor chip further may include internal interconnections respectively disposed between the first cell region and the first conductive pad to electrically connect the first cell region and the first conductive pad, and between the second cell region and the second conductive pad to electrically connect the second cell region and the second conductive pad.

The semiconductor chip further may include connection terminals disposed between the second conductive lead and the first conductive pad and between the second conductive lead and the second conductive pad, respectively.

The substrate may further include a protective electrical insulating layer on the base layer.

The first and second conductive leads may be spaced apart from each other on the base layer of the substrate.

The substrate may have at one side thereof a mounting region over which the semiconductor chip extends, and a non-mounting region over which the semiconductor chip does not extend.

The first and second conductive leads may be exposed by the substrate at the mounting region but be covered by the protective electrical insulating layer at the non-mounting region.

Each of the first and the second conductive leads may extend from and terminate at an edge of the substrate.

The second conductive lead may be longer than the first conductive lead and extends across the mounting region.

The signal transmitted from the second lead to the first and second conductive pads may include at least one of power signal, ground signal and date signal.

The present inventive concept also provides a semiconductor package including: a substrate including a base layer, conductive leads extending long the base layer, the conductive leads including a set of first conductive leads, and a second conductive lead discrete from the set of the first conductive leads, each of the conductive leads having first and second ends, and the length of the second conductive lead between the ends thereof being greater than the length of each of the first conductive leads between the ends thereof; and a semiconductor chip having a surface partitioned into a group of cell regions of electronic devices such that the cell regions are spaced from one another on the surface, and conductive pads electrically connected to the cell regions independently of one another, the cell regions including a first cell region, a second cell region that is electrically isolated from the first cell region in the chip, and at least one other cell region, the conductive pads including a first conductive pad electrically connected to the first cell region, a second conductive pad electrically connected to the second cell region, and other conductive pads electrically connected to the at least one other cell region, wherein the semiconductor chip is mounted to the substrate with the first and second conductive pads both disposed on and connected to the second conductive lead, whereby the first cell region and the second cell region will both receive power or a signal transmitted to the second conductive lead from an outside source.

The substrate may define an opening therein in which the chip is received, and each of the conductive leads has an inner section extending into and terminating within the opening such that one end each of the conductive leads may be located in the opening, and each of the conductive leads may have an outer section embedded in the substrate.

The outer section of each of the conductive leads may terminate at an edge of the substrate such that the other end of each of the conductive leads may be located at the edge of the substrate.

The substrate may include a protective insulating layer on the base layer, and the outer section of each of the conductive leads may be interposed between the base layer and the protective layer.

The first and second cell regions may be disposed adjacent to each other and symmetrically with respect to one another about a plane that bisects the surface of the chip in at least one of a lengthwise and a widthwise direction of the chip.

The conductive leads may be each a linearly extending bar shaped element of conductive material, and wherein the first conductive pad, the first cell region, the second cell region and the second conductive pad may be aligned along a path extending parallel to the second conductive lead.

The semiconductor chip may further include internal interconnections respectively disposed between the first cell region and the first conductive pad to electrically connect the first cell region and the first conductive pad, and between the second cell region and the second conductive pad to electrically connect the second cell region and the second conductive pad.

BRIEF DESCRIPTION OF THE DRAWINGS

These and other objects, features and advantages of the present inventive concept will become clearer from the detailed description of the preferred embodiments thereof made with reference to the accompanying drawings. In the drawings.

DETAILED DESCRIPTION OF THE PREFERRED EMBODIMENTS

Preferred embodiments of the present inventive concept will be described below in more detail with reference to the accompanying drawings. The present inventive concept may, however, be embodied in different forms and should not be construed as limited to the embodiments set forth herein. Rather, these embodiments are provided so that this disclosure will be thorough and complete, and will fully convey the scope of the present inventive concept to those skilled in the art. Like numbers designate like elements throughout the drawings.

A first embodiment of a semiconductor package 500 according to the present inventive concept will now be described with reference to FIGS. 1 through 7.

Figure 1:
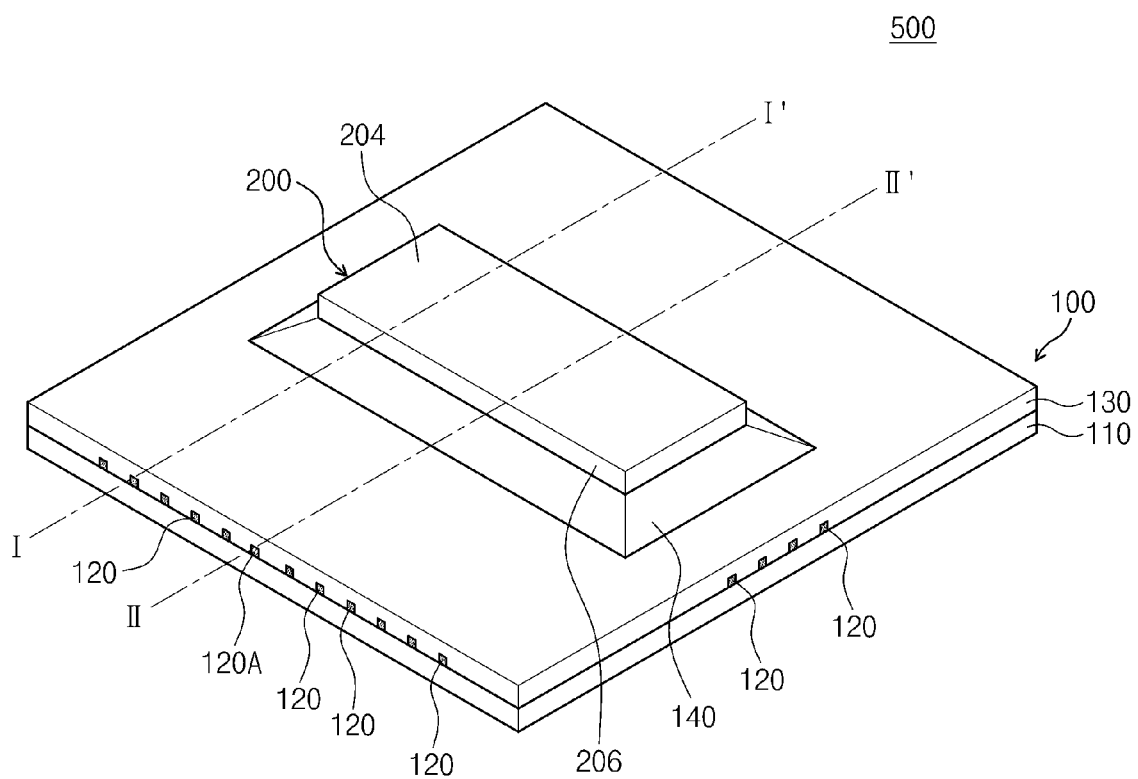
FIG. 1 is a perspective view of an embodiment of a semiconductor package according to the present inventive concept.
Figure 2:
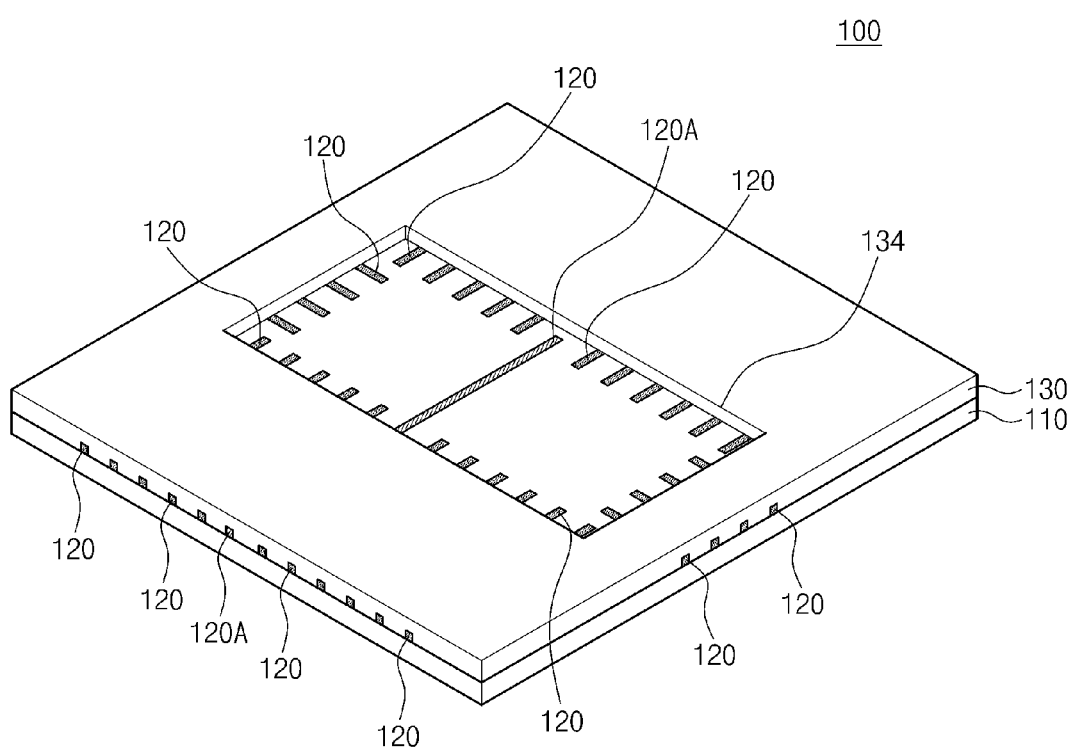
FIG. 2 is a perspective view of an embodiment of an interconnection substrate of the semiconductor package, according to the present inventive concept.

Referring first to FIG. 1, the semiconductor package 500 includes an interconnection substrate 100 and a semiconductor chip 200 mounted on the interconnection substrate 100.

Referring to FIGS. 1, 2, 4 and 5, the interconnection substrate 100 has a mounting region 302 occupied by the semiconductor chip 200 when the chip 200 is mounted to the substrate 100, and a non-mounting region 304 which is not occupied by the semiconductor chip 200 when the chip 100 is mounted to the substrate. The interconnection substrate 100 includes a base layer 110, a pattern of leads 120 and 120A and a protection insulating layer 130 covering portions of the leads 120 and 120A. The base layer 110 may be a polyimide layer. The protection insulating layer 130 may be a solder resist layer.

The interconnection substrate 100 may also include a supplementary insulating layer 140 disposed between the interconnection substrate 100 and the semiconductor chip 200 and extending along and up against the sides 206 of the semiconductor chip 200. The supplementary insulating layer 140 may comprise an insulating resin-based material. The protection insulating layer 130 and the supplementary insulating layer 140 can protect not only the leads 120 and 120A but also the semiconductor package 500.

The leads 120 and 120A are spaced apart from one another on the base layer 110 and may be formed of copper (Cu) using a damascene process because copper possesses superior conductivity. Each of the leads 120 and 120A may have the shape of a bar.

An outer end of each of the leads 120 and 120A is exposed at a side surface of the base layer 110. Also, an opening in the protection insulating layer 130 at the mounting region 302 of the substrate 100 exposes an inner end portion of each of the leads 120 and 120A. Thus, the leads 120 and 120A may electrically connect the semiconductor chip 200 and an external device.

The protection insulating layer 130 covers the sections of the leads 120 and 120A which extend in the non-mounting region 304 of the substrate 100. The protection insulating layer 130 is also interposed between the leads 120 and 120A to electrically isolate the leads 120 and 120A from one another.

Referring now to FIGS. 1, 2, and 4 through 6, the leads 120 and 120A may include first leads 120 and a second or individual lead 120A. Each of the first leads 120 has an inner lead section 120I and an outer lead section 120T extending from the inner lead section 120I. The inner lead section 120I is exposed in the chip-mounting region 302. The outer lead section 120T is covered by the protection insulating layer 130 in the non-mounting region 304.

The second lead 120A has an inner lead section 120AI and an outer lead section 120AT extending from the inner lead section 120AI. The inner lead section 120AI is exposed in the chip-mounting region 302. The outer lead section 120AT is covered by the protection insulating layer 130 in the non-mounting region 304. Furthermore, the inner lead section 120AI of the second lead 120A is longer than the inner lead section 120I of each of the first leads 120.

Figure 3:
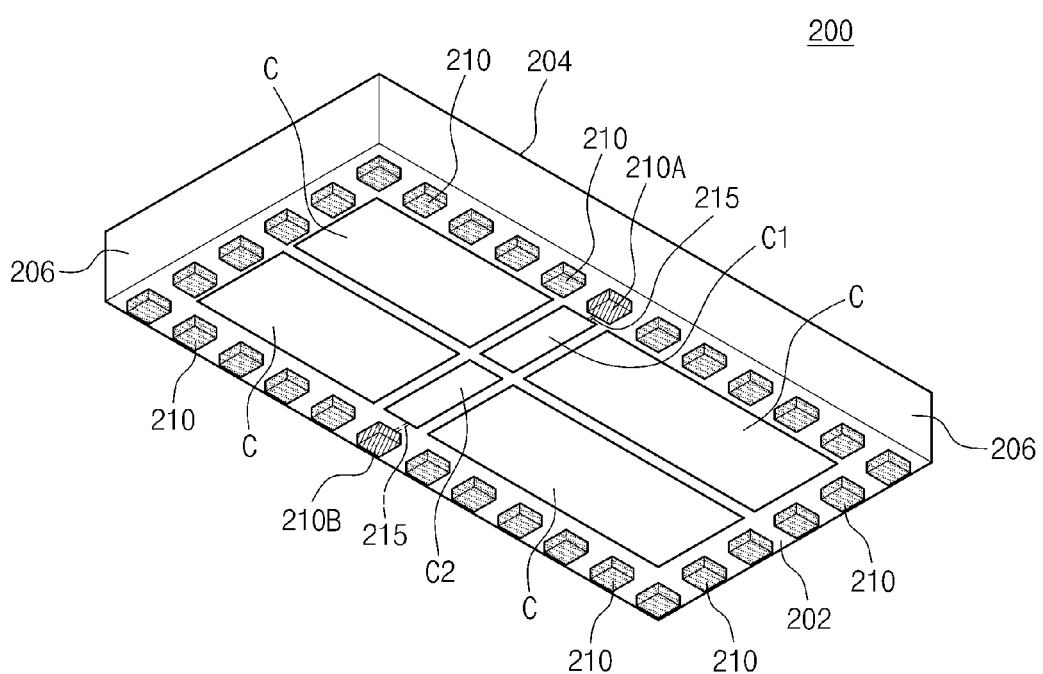
FIG. 3 is a perspective view of a semiconductor chip of the semiconductor package according to the present inventive concept.
Figure 4:
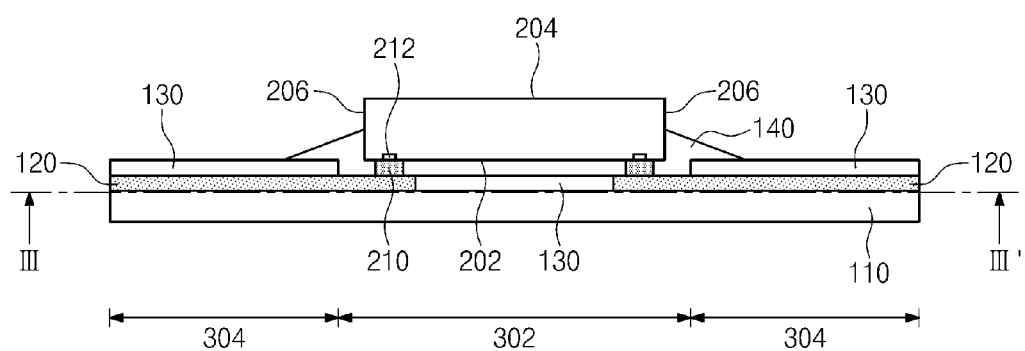
FIG. 4 is a cross-sectional view of the semiconductor package taken along the dotted line I-I' of FIG. 1.
Figure 5:
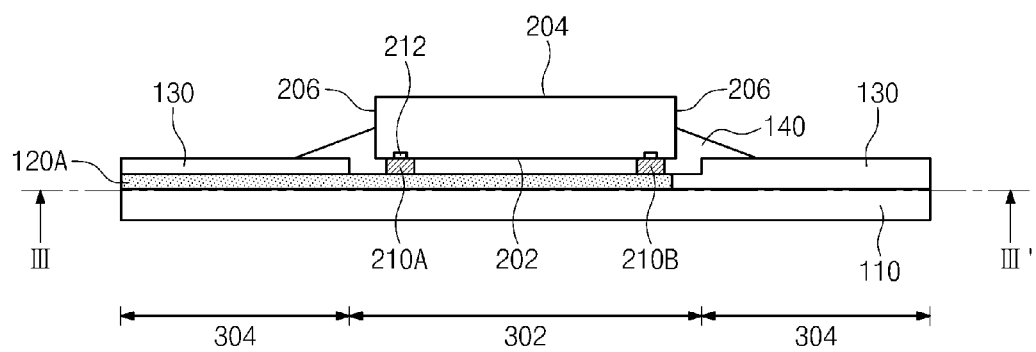
FIG. 5 is a cross-sectional view of the semiconductor package taken along the dotted line II-II' of FIG. 1.

Referring to FIGS. 3 through 5, the semiconductor chip 200 has a top surface 202 and a bottom surface 204 facing in opposite directions, and side surfaces 206 facing away from each other. The top surface 202 is an active surface at which cell regions (C, C1, C2) and chip pads 212 are provided. The semiconductor chip 200 is mounted to the interconnection substrate 100 with the top surface 202 adjacent the interconnection substrate 100 in the mounting region 302. A process such as a thermo-compression bonding or thermo-sonic bonding process may be used to mount the semiconductor chip 200 to the interconnection substrate 100.

The top surface 202 is partitioned so that the cell regions (C, C1, C2) are spaced from each other. Each of the cell regions (C, C1, C2) is made up of electronic devices (not shown) such as transistors. The electronic devices are electrically connected to one another in each of the cell regions (C, C1, C2) by conductors (not shown). Each of the cell regions (C, C1, C2) may comprise a logic circuit, an output driving circuit and a memory.

In the embodiment of FIG. 3, the cell regions (C, C1, C2) include a first cell region (C1), a second cell region (C2) and third cell regions (C). The first and second cell regions (C1, C2) are disposed symmetrically about at least one of the planes that bisect the active surface (lengthwise and/or widthwise). The first cell region (C1) is dedicated to receive power and/or a certain type of signal from an outside source. The second cell region (C2) is for receiving the same signal as the first cell region (C1). The third cell regions (C) are configured differently from the first and second cell regions (C1, C2).

The first through third cell regions (C1, C2, C) are electrically connected to the chip pads 212. Connection terminals 210, 210A and 210B are disposed on the chip pads 212. The connection terminals may be respectively disposed on the chip pads 212. For example, the connection terminals 210, 210A and 210B may be bumps. In this case, the connection terminals 210, 210A and 210B are arrayed similarly to the chip pads 212. Therefore, each chip pad 212 and the connection terminal disposed thereon constitute conductive structures in electrical contact with one another.

Again, referring to the embodiment of the present inventive concept shown in FIG. 3, the connection terminals 210, 210A and 210B surround the cell regions (C, C1, C2). Thus, the connection terminals 210, 210A and 210B may be disposed along an edge of the top surface 202 of the semiconductor chip 200. The connection terminals 210, 210A and 210B include first conductive terminals 210 disposed adjacent and electrically connected to respective portions of the third cell regions (C), and second conductive terminals 210A and 210B disposed adjacent and electrically connected to the first and second cell regions (C1, C2), respectively. To this end, the first and second cell regions (C1, C2) are interposed between the first and second terminals 210A and 210B. No terminal (conductor) is provided on the active surface between the first cell region (C1) and the second cell region (C2).

Referring to FIGS. 3 through 6, the first leads 120 are electrically connected to the first conductive terminals 210. More specifically, the inner sections 1201 of the first leads 120, exposed at the mounting region 302, are electrically connected to the first conductive terminals 210. The second lead 120A is electrically connected to the first terminal 210A and the second terminal 210B. More specifically, the inner section 120AI of the second lead 120A, exposed at the mounting region 302, is electrically connected to both the first and second terminals 210A and 210B. To facilitate this, the first terminal 210A, the first cell region (C1), the second cell region (C2) and the second terminal 210B may aligned along the second lead 120AI.

The connection terminals 210, 210A and 210B and the cell regions (C, C1, C2) associated therewith are electrically connected to one another by internal interconnections (conductors) extending from the chip pads 212 to the cell regions (C, C1, C2). For example, internal interconnections 215 electrically connect the first terminal 210A to the first cell region (C1) and electrically connect the second terminal 210B to the second cell region (C2), respectively. In this respect, one of the internal interconnections 215 extends linearly between the chip pad 212, on which the first terminal 210A is disposed, and the first cell region (C1). The other of the internal interconnections 215 extends linearly between the chip pad 212, on which the second terminal 210B is disposed, and the second cell region (C2).

According to an aspect of the present inventive concept as described above, a lead (specifically, the inner section 120AI of the second lead 120A) is used to deliver the same signal to several cell regions (cell regions C1 and C2). Thus, an internal interconnection between and/or around the cell regions C1 and C2 is not required, thereby saving space. Accordingly, the semiconductor chip 200 does not need to be as large, and the semiconductor package 500 can be more highly integrated.

Figure 6:
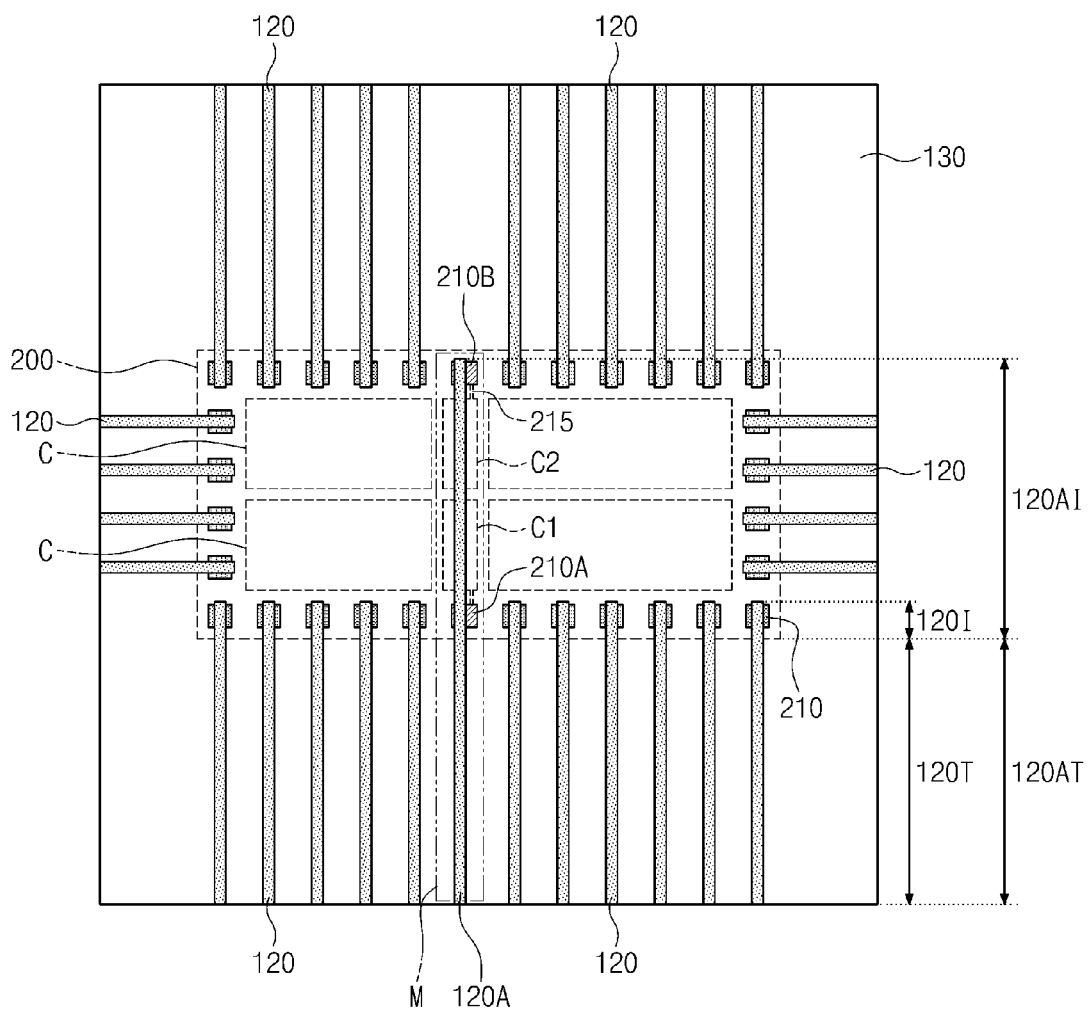
FIG. 6 is a sectional view of the package taken along the dotted line III-III' of FIG. 4 or FIG. 5.
Figure 7:
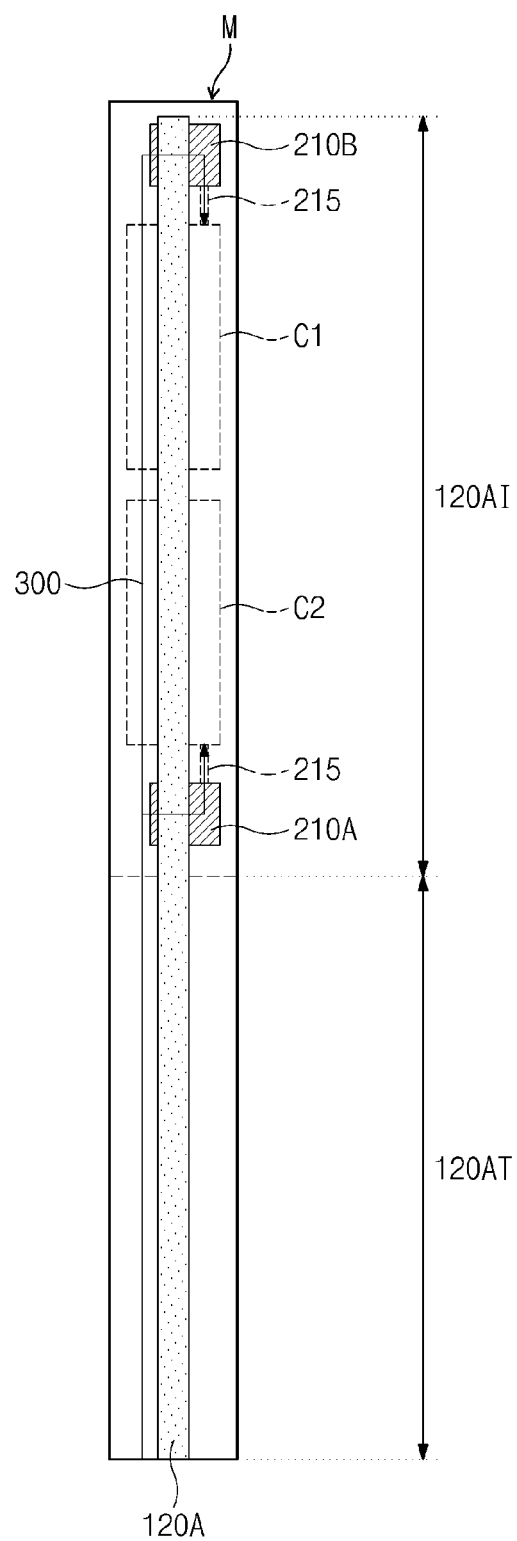
FIG. 7 is an enlarged view of a region M of the package in FIG. 6.

FIG. 7 is an enlarged view of region M of FIG. 6. Referring to FIG. 7, the inner section 120AI of the second lead 120A may be disposed just under the first terminal 210A and the second terminal 210B as in contact with the first terminal 210A and the second terminal 210B. Thus, according to an aspect of the present inventive concept, the same signal may be rapidly transmitted to the cell regions C1 and C2 compared to the case in which an internal interconnection(s) electrically connects the cell regions C1 and C2. Reference numeral 300 designates the common path of transmission of the signal to the cell regions C1 and C2. Thus, the voltage drop across the cell region C1 and C2 is minimal, and the semiconductor package 500 will not exhibit a significant delay in signal transmission.

Figure 8A:
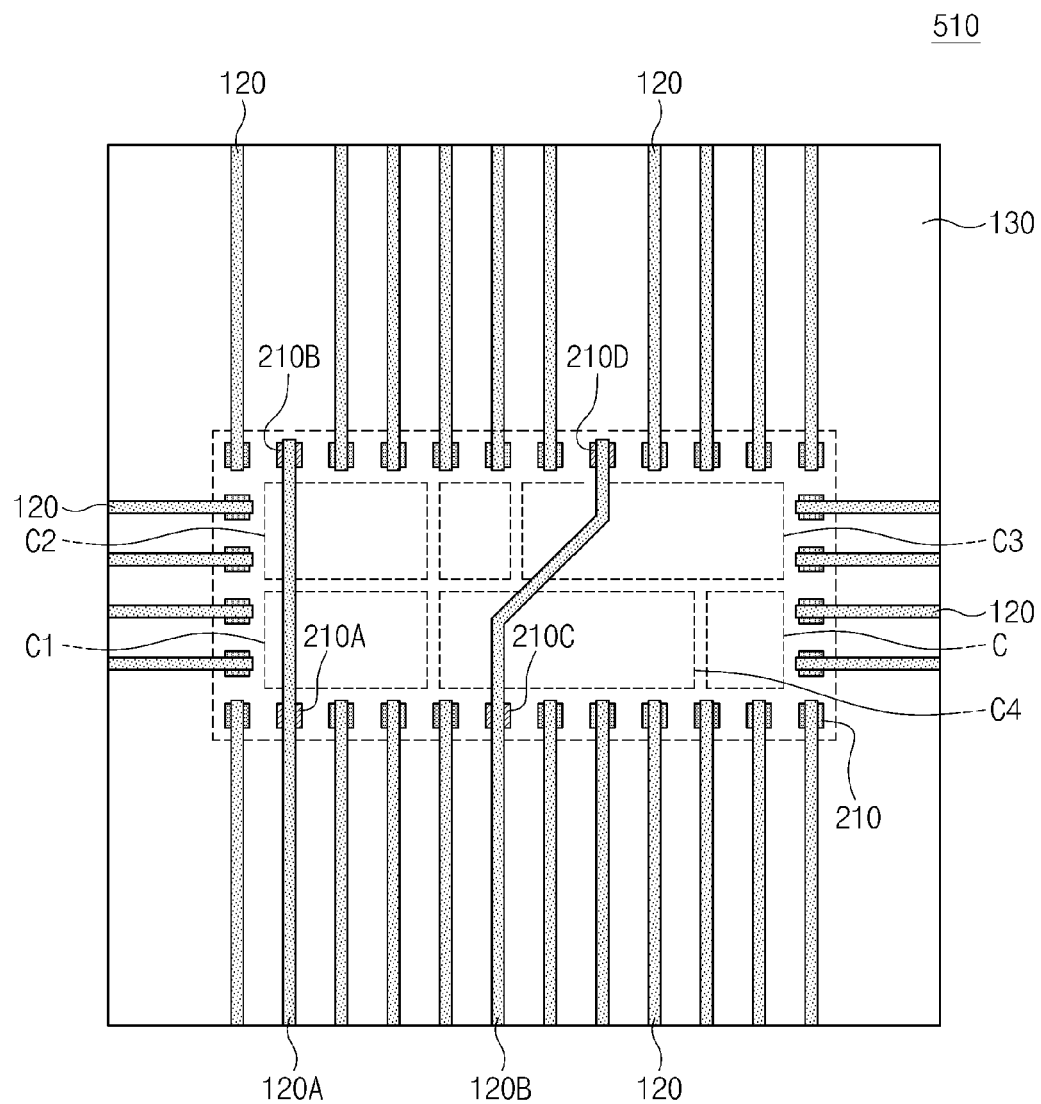
FIGS. 8A and 8B are sectional views, similar to that of FIG. 6, of other embodiments of a semiconductor package according to the present inventive concept.
Figure 8B:
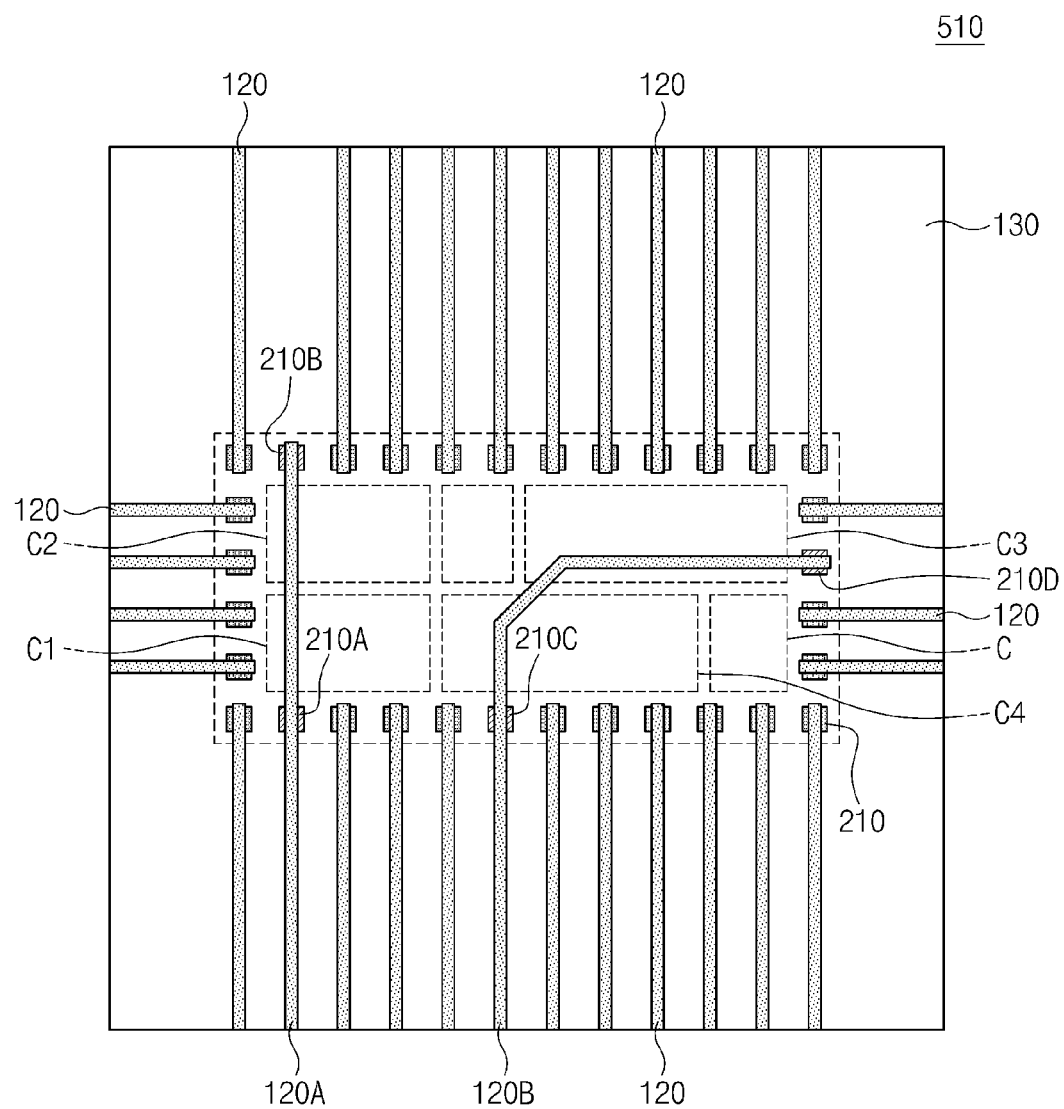

FIGS. 8A and 8B are sectional views, similar to that of FIG. 6, of other embodiments of a semiconductor package according to the present inventive concept. These embodiments are similar to the embodiment of the present inventive concept described above in connection with FIGS. 1-7. Thus, features/elements that the embodiments of FIGS. 8A and 8B have in common with the embodiment of FIGS. 1-7 will not be described in detail or will only be described briefly for brevity.

Referring now to FIGS. 8A and 8B, a semiconductor package 510 according to the present inventive concept includes an interconnection substrate including leads 120, a first (individual) lead 120A and a second (individual) lead 120B, and a semiconductor chip 200 mounted to the interconnection substrate and having cell regions C, C1, C2, C3 and C4 and terminals 210, 210A, 210B, 210C and 210D electrically connected to the cell regions, respectively.

The same signal are/is provided to first and second cell regions (C1, C2) by the first lead 120A. To this end, the first lead 120A extends across a side and a central portion of a top surface 202 of the semiconductor chip 200 according to the arrangement (alignment) of the first and second cell regions (C1, C2), the first terminal 210A electrically connected to the first cell region C1 and the second terminal 210B electrically connected to the second cell region C2.

The third and fourth cell regions (C3, C4) are not symmetrically disposed with respect to a plane that bisects the active surface of the chip 200. Thus, the third terminal 210C and fourth terminal 210D electrically connected to the third and fourth cell regions (C3, C4) are not disposed symmetrically with respect to a plane that bisects the active surface of the chip 200.

The same signal are/is provided to the third and fourth cell regions (C3, C4) by the second lead 120B. To this end, the second lead 120B has an outer linear section, and an inner linear section that extends obliquely from the inner section. That is, the inner and outer sections of the second lead 120B subtend an angle greater than 90°. The second lead 120B may be bent between the third terminal 210C and fourth terminal 210D. In this way, (the inner section of) the second lead 120B is readily electrically connected to and disposed in contact with both the third terminal 210C and the fourth terminal 210D. The inner section of the second lead 120B may have various other shapes, though, as long as it connects to the asymmetrically disposed terminals 210C and 210D.

Figure 9:
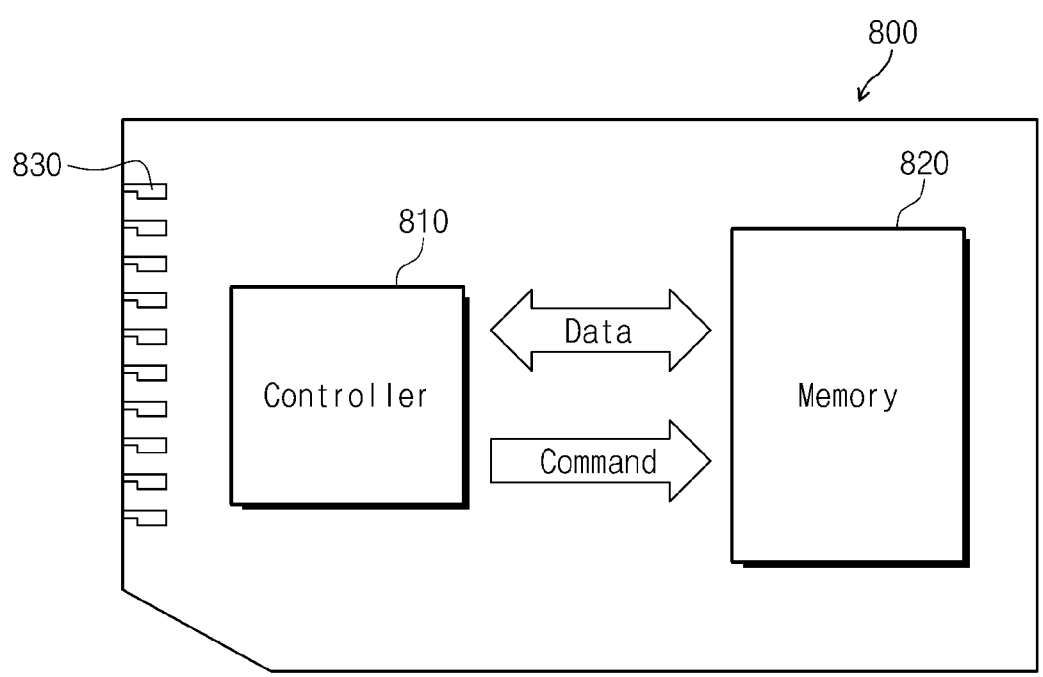
FIG. 9 is a schematic diagram of a memory card system including a semiconductor package according to the present inventive concept.

FIG. 9 illustrates a memory card system 800 including a semiconductor package according to the present inventive concept.

Referring to FIG. 9, the memory card system 800 comprises a controller 810, a memory 820 and an interface 830. The memory 820, for example, may comprise a semiconductor package according to the present inventive concept. The memory 820 stores commands executed by the controller 810 and/or user's data. The controller 810 and the memory 820 may transmit and receive commands and/or data. The interface 830 transmits data to an external source and receives data from an external source.

The memory card system 800 may be a multimedia card (MMC), a secure digital card (SD) or a portable data storage card.

Figure 10:
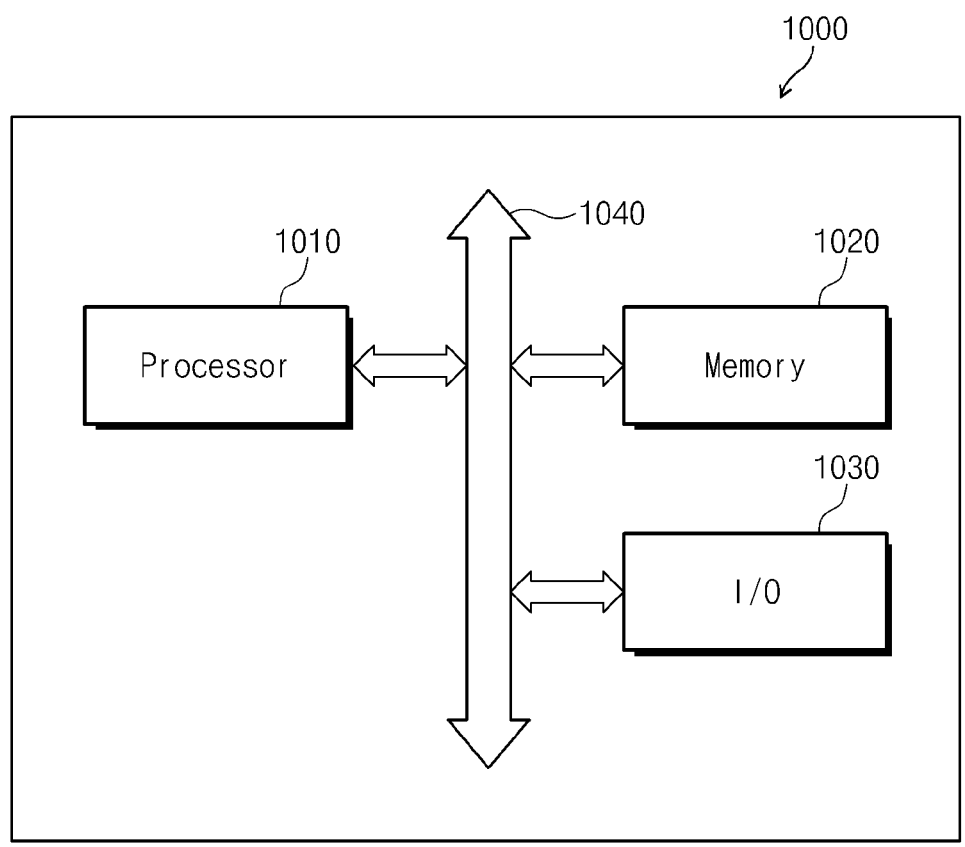
FIG. 10 is a block diagram of an electronic device including a semiconductor package according the present inventive concept.

FIG. 10 is a block diagram of an electronic device 1000 including a semiconductor package according to the present inventive concept.

Referring to FIG. 10, the electronic device 1000 comprises a processor 1010, a memory 1020 and an input/output (I/O) device 1030. The processor 1010, the memory 1020 and the input/output (I/O) device are connected to one another through a bus 1040. The processor 1010 and/or memory 1020, for example, comprise a semiconductor package according to the present inventive concept.

The memory 1020 may receive a control signal such as a RAS (Row address strobe), WE (Write enable), CAS (Column address strobe) or the like from the processor 1010. The memory 1020 may be used to store data accessed through the bus 1040. It will be apparent to those of ordinary skill in the art that the electronic device 1000 may include additional components, each of which may also.

The electronic device 1000 may be used in a wired or a wireless system such as a personal digital assistant (PDA), a lap top computer, a portable computer, a web tablet, a wireless telephone, a cell phone, a digital music player, an MP3 player, a navigation system (GPS), a solid state disk (SSD), or a household appliance.

Finally, although the present inventive concept has been described with reference to the preferred embodiments thereof, the present inventive concept may be embodied in other ways. Therefore, it is to be understood that the foregoing description is illustrative of the present inventive concept and that the present inventive concept is not limited to the specific embodiments disclosed. Rather, other embodiments and modifications of the disclosed embodiments may fall within the true spirit and scope of the inventive concept as defined by the appended claims.

What is claimed is:

1. A semiconductor package comprising:
a substrate including a base layer, first and second conductive leads extending along the base layer; and
a semiconductor chip having at least a first cell region of electronic devices and a second cell region of electronic devices such that the first and second cell regions are spaced from one another, a first conductive pad electrically connected to the first cell region, and a second conductive pad electrically connected to the second cell region,
wherein the semiconductor chip is mounted to the substrate with the first and second conductive pads both disposed on and connected to the second conductive lead, whereby the first cell region and the second cell region both receive a signal transmitted to the second conductive lead from an outside source.

2. The semiconductor package of claim 1, wherein the first and second cell regions are disposed adjacent to each other and symmetrically with respect to one another about a plane that bisects the chip in at least one of a lengthwise and a widthwise direction of the chip.

3. The semiconductor package of claim 1, wherein the second conductive lead has at least a bending portion between the first conductive pad and the second conductive pad.

4. The semiconductor package of claim 1, wherein the first conductive pad is disposed at one side of the semiconductor chip, and the second conductive pad is disposed at another side of the semiconductor chip.

5. The semiconductor package of claim 1, wherein the semiconductor chip further comprises internal interconnections respectively disposed between the first cell region and the first conductive pad to electrically connect the first cell region and the first conductive pad, and between the second cell region and the second conductive pad to electrically connect the second cell region and the second conductive pad.

6. The semiconductor package of claim 1, wherein the semiconductor chip further comprises connection terminals disposed between the second conductive lead and the first conductive pad and between the second conductive lead and the second conductive pad, respectively.

7. The semiconductor package of claim 1, wherein the substrate further comprises a protective electrical insulating layer on the base layer.

8. The semiconductor package of claim 1, wherein the first and second conductive leads are disposed at the same level in the package as spaced apart from each other on the base layer of the substrate.

9. The semiconductor package of claim 1, wherein the substrate has at one side thereof a mounting region over which the semiconductor chip extends, and a non-mounting region over which the semiconductor chip does not extend.

10. The semiconductor package of claim 9, wherein the first and second conductive leads are exposed by the substrate at the mounting region but are covered by the protective electrical insulating layer at the non-mounting region.

11. The semiconductor package of claim 1, wherein each of the first and the second conductive leads extends from and terminates at an edge of the substrate.

12. The semiconductor package of claim 9, wherein the second conductive lead is longer than the first conductive lead and extends across the mounting region.

13. A semiconductor package comprising:
a substrate including a base layer, conductive leads extending long the base layer, the conductive leads including a set of first conductive leads, and a second conductive lead discrete from the set of the first conductive leads, each of the conductive leads having first and second ends, and the length of the second conductive lead between the ends thereof being greater than the length of each of the first conductive leads between the ends thereof; and a semiconductor chip having a surface partitioned into a group of cell regions of electronic devices such that the cell regions are spaced from one another on the surface, and conductive pads electrically connected to the cell regions independently of one another, the cell regions including a first cell region, a second cell region that is electrically isolated from the first cell region in the chip, and at least one other cell region, the conductive pads including a first conductive pad electrically connected to the first cell region, a second conductive pad electrically connected to the second cell region, and other conductive pads electrically connected to the at least one other cell region, wherein the semiconductor chip is mounted to the substrate with the first and second conductive pads both disposed on and connected to the second conductive lead, whereby the first cell region and the second cell region both receive power or a signal transmitted to the second conductive lead from an outside source.

14. The semiconductor package of claim 13, wherein the substrate defines an opening therein in which the chip is received, and each of the conductive leads has an inner section extending into and terminating within the opening such that one end each of the conductive leads is located in the opening, and each of the conductive leads has an outer section embedded in the substrate.

15. The semiconductor package of claim 14, wherein the outer section of each of the conductive leads terminates at an edge of the substrate such that the other end of each of the conductive leads is located at the edge of the substrate.

16. The semiconductor package of claim 15, wherein the substrate includes a protective insulating layer on the base layer, and the outer section of each of the conductive leads is interposed between the base layer and the protective layer.

17. The semiconductor package of claim 13, wherein the first and second cell regions are disposed adjacent to each other and symmetrically with respect to one another about a plane that bisects the surface of the chip in at least one of a lengthwise and a widthwise direction of the chip.

18. The semiconductor package of claim 13, wherein the conductive leads are each a linearly extending bar shaped element of conductive material, and wherein the first conductive pad, the first cell region, the second cell region and the second conductive pad are aligned along a path extending parallel to the second conductive lead.

19. The semiconductor package of claim 13, wherein the semiconductor chip further comprises internal interconnections respectively disposed between the first cell region and the first conductive pad to electrically connect the first cell region and the first conductive pad, and between the second cell region and the second conductive pad to electrically connect the second cell region and the second conductive pad.

20. The semiconductor package of claim 13, wherein the first and second conductive leads are disposed at the same level in the package as spaced apart from each other on the base layer of the substrate.

* * * * *